United States Patent
Kamata (10) Patent No.: US 7,100,090 B2
(45) Date of Patent: Aug. 29, 2006

(54) SEMICONDUCTOR MEMORY DEVICE HAVING A TEST CIRCUIT

(75) Inventor: Yoshihiko Kamata, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 555 days.

(21) Appl. No.: 10/635,007

(22) Filed: Aug. 6, 2003

(65) Prior Publication Data

US 2004/0153732 A1     Aug. 5, 2004

(30) Foreign Application Priority Data

Aug. 16, 2002   (JP) .............................. 2002-237522

(51) Int. Cl.
  *G06F 11/00*       (2006.01)
  *G11C 7/00*        (2006.01)
(52) U.S. Cl. ..................... 714/42; 714/6; 714/7; 714/8; 714/710; 714/711; 365/200; 365/201
(58) Field of Classification Search ................ 714/6–8, 714/42, 710, 711; 365/200, 201
  See application file for complete search history.

(56) References Cited

U.S. PATENT DOCUMENTS

| | | | | |
|---|---|---|---|---|
| 5,809,225 A | * | 9/1998 | Ohsawa et al. ............... | 714/32 |
| 5,841,709 A | * | 11/1998 | McClure ...................... | 365/200 |
| 6,182,257 B1 | * | 1/2001 | Gillingham .................. | 714/733 |
| 6,208,570 B1 | * | 3/2001 | Brown et al. ................ | 365/201 |
| 6,259,636 B1 | | 7/2001 | Fukuda et al. | |
| 6,349,064 B1 | | 2/2002 | Nakaoka | |
| 6,411,556 B1 | | 6/2002 | Amano | |
| 6,483,773 B1 | * | 11/2002 | Fister ......................... | 365/236 |
| 6,735,727 B1 | * | 5/2004 | Lee ............................ | 714/711 |
| 6,967,878 B1 | * | 11/2005 | Dono ......................... | 365/200 |

* cited by examiner

*Primary Examiner*—Robert Beausoliel
*Assistant Examiner*—Emerson Puente
(74) *Attorney, Agent, or Firm*—VolentineFrancos&Whitt PLLC (57) ABSTRACT

A semiconductor memory device includes memory cells, redundant cells, a redundancy repair control circuit and a test mode control circuit. Each of the memory cells is assigned a unique address to be accessed by a corresponding address. The redundant cells are replaceable with the memory cells. The redundancy repair control circuit replaces predetermined memory cells among the memory cells with the redundant cells. The test mode control circuit invalidates an operation of the redundancy repair control circuit and assigns an additional unique address to the redundant cells so that all of the memory cells and the redundant cells are accessible during a test mode.

17 Claims, 10 Drawing Sheets

SEMICONDUCTOR MEMORY DEVICE HAVING A TEST CIRCUIT

BACKGROUND OF THE INVENTION

The present invention relates to a method for testing a semiconductor memory device and to a semiconductor memory device, particularly to a method for testing a semiconductor memory device having a plurality of memory cells, each of them assigned a unique address beforehand, redundant cells equivalent to the memory cells and replaceable with the memory cells, and a redundancy repair function mode for replacing a predetermined memory cell with the redundant cell, and a semiconductor memory device applicable to the method.

A semiconductor memory device is provided with a memory array having a plurality of memory cells (so-called cells) two-dimensionally arranged. Even a single defective memory cell (hereafter, it is called defective cell) is in the memory array, and then the device is turned to be a defective piece. On this account, the semiconductor memory device is generally provided with a redundant memory having a plurality of spare memory cells (so-called redundant cells) arranged beforehand for replacing a defective cell generated at fabrication process steps with a redundant cell to improve fabrication yields (so-called redundancy repair). This replacement is conducted by the row or column in which a word line or bit line in the redundant memory is selected instead of selecting a word line or bit line corresponding to a defective cell in the memory cells. Hereafter, selecting a word line in the redundant memory instead of a word line in the memory cells is referred to as row replacement, and selecting a bit line in the redundant memory instead of a bit line in the memory cells is referred to as column replacement. Traditionally, in a semiconductor memory device (device) having a redundancy repair function, access first has been made to each of the memory cells inside the address space of the device, that is, inside the cell area, and an operation test has been conducted to verify each of the memory cells to be normal or not. When the operation test has found a defective cell, row replacement or column replacement has been performed as described above to replace the defective cell with a redundant cell, and the operation test has been again conducted. Then, device chips verified to be normal at the first test and device chips verified to be normal at the retest have been cut out of a wafer for packaging.

However, according to this method, a redundant cell will not be verified to be defective or not until it is replaced with a defective cell. Therefore, there has been a problem that redundancy repair cannot be done when the replaced redundant cell may be defective.

In addition, it is also possible that redundant cells are replaced at arbitrary addresses in the cell area so as to be accessible to the redundant cells, and then the redundant cells also undergo the operation test to replace normal redundant cells with defective cells in the memory array. However in this case, the operation test for the cells and the operation test for the redundant cells are conducted independently. Thus, there has been a problem that the time required for the tests is prolonged.

SUMMARY OF THE INVENTION

The invention may provide a semiconductor memory device capable of improving yields and shortening the test time for redundancy repair.

A semiconductor memory device according to the present invention includes memory cells, redundant cells, a redundancy repair control circuit and a test mode control circuit. Each of the memory cells is assigned a unique address to be accessed by a corresponding address. The redundant cells are replaceable with the memory cells. The redundancy repair control circuit replaces predetermined memory cells among the memory cells with the redundant cells. The test mode control circuit invalidates an operation of the redundancy repair control circuit and assigns an additional unique address to the redundant cells so that all of the memory cells and the redundant cells are accessible during a test mode.

BRIEF DESCRIPTION OF THE DRAWINGS

The teachings of the invention can be readily understood by considering the following detailed description in conjunction with the accompanying drawings, in which.

DETAILED DESCRIPTION OF THE INVENTION

Next, one example of embodiments in the invention will be described in detail with reference to the drawings.

Figure 1:
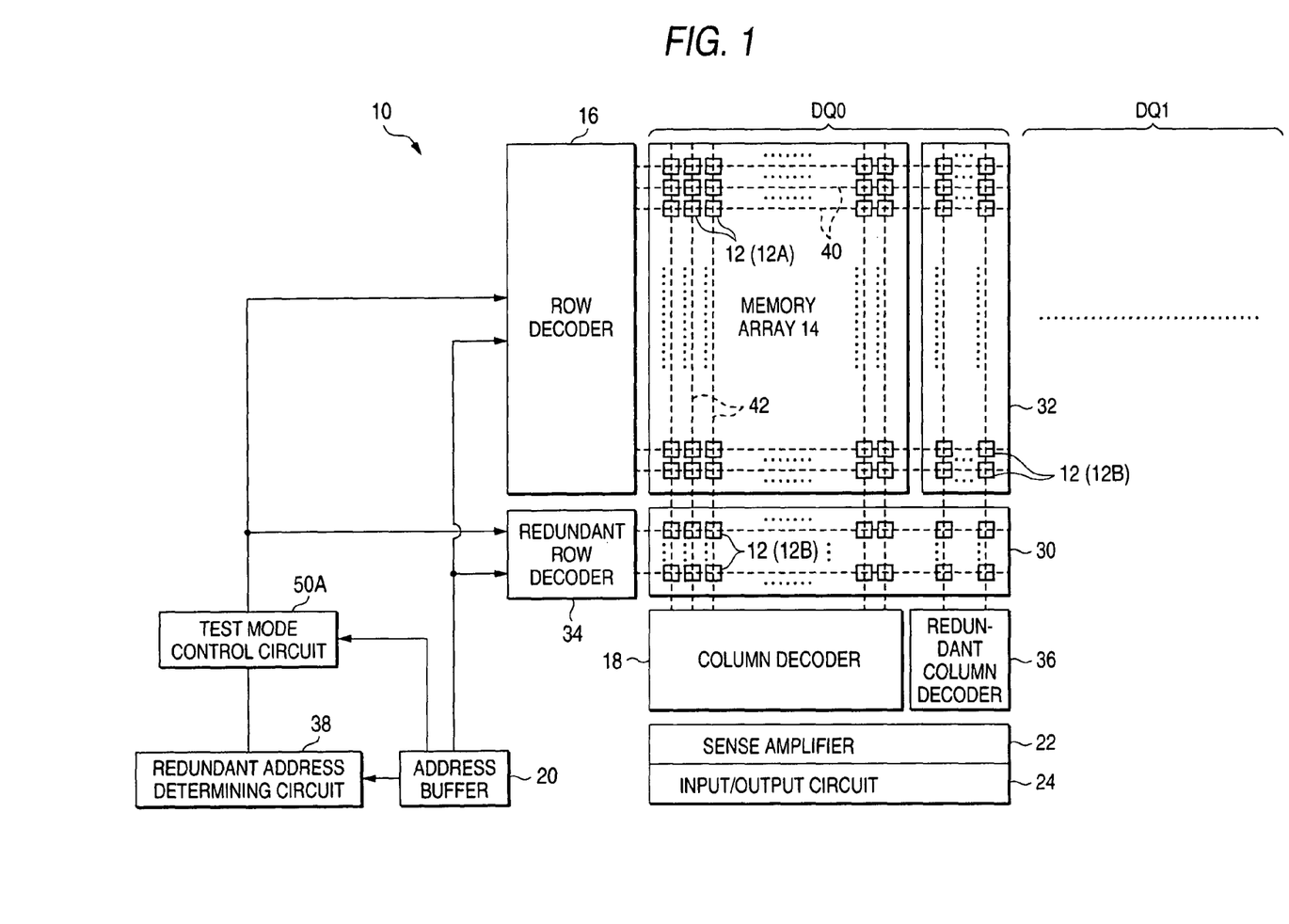
FIG. 1 is a block diagram illustrating the schematic configuration of a semiconductor memory device in a first embodiment.

FIG. 1 depicts the circuit configuration of a semiconductor memory device 10 in a first embodiment of the invention.

As shown in FIG. 1, the semiconductor memory device 10 is provide with a memory array 14 having a plurality of memory cells 12 arranged in a two-dimensional matrix where each of the memory cells 12 is assigned beforehand a unique address defined by the position in the row direction and the position in the column direction, a row decoder 16 and a column decoder 18 for selecting the memory cell 12 corresponding to the specified address among the plurality of the memory cells 12 in the memory array 14, an address buffer 20 for specifying the address of the memory cell 12 to be accessed based on address signals inputted from outside, a sense amplifier 22 for detecting output signals from the memory cells for amplifying, and an input/output circuit 24 for inputting and outputting information to outside.

In addition, the semiconductor memory device 10 is provided with a row redundant memory 30 and a column redundant memory 32 as spare memories having a plurality of memory cells 12 for being replaced with defective cells as the redundancy repair function, a redundant row decoder 34 and a redundant column decoder 36 for selecting the memory cell 12 corresponding to the specified address from the row redundant memory 30 and the column redundant memory 32, and a redundant address determining circuit 38 for switching the subject of the memory cells 12 for selection between the memory array 14 and the row redundant memory 30 or between the memory array 14 and the column redundant memory 32.

In the memory array 14, the row redundant memory 30 and the column redundant memory 32, the memory cells 12 for storing one-bit information are arranged two-dimensionally. Word lines 40 are disposed in correspondence with the separate rows of the memory cells 12, and bit lines 42 are disposed in correspondence with the separate columns.

Generally, in the semiconductor memory device 10, cells corresponding to the device performance are set to be the memory array 14 and the rest are used as the row redundant memory 30 and the column redundant memory 32 among the plurality of the memory cells 12 two-dimensionally arranged over a single memory pad. Therefore, the memory array 14 and the row redundant memory 30 share the bit lines 42, and the memory array 14 and the column redundant memory 32 share the word lines 40.

In the embodiment, the memory array 14 is formed of 256 rows of the memory cells 12, that is, the example where 256 lines of the word lines 40 are disposed in the memory array 14 will be described. Thus, the row address space of the device (addresses in the row direction of the cells in the memory array 14) are 00h to FFh (the last digit h indicates a hexadecimal number). In addition, the row decoder 16 has 16 word line drivers 60 in total, one driver for each pair where 16 word lines in the memory array 14 make one pair (see FIG. 2).

Furthermore, the embodiment has two row redundant memories 30 provided with 16 lines of the word lines 40, that is, two row redundant memories 30 formed of 16 rows of the memory cells 12. The example will be described in which the redundant row decoder 34 has two redundant word line drivers 68 in total, one for each of the row redundant memories 30 (see FIG. 2).

Figure 2:
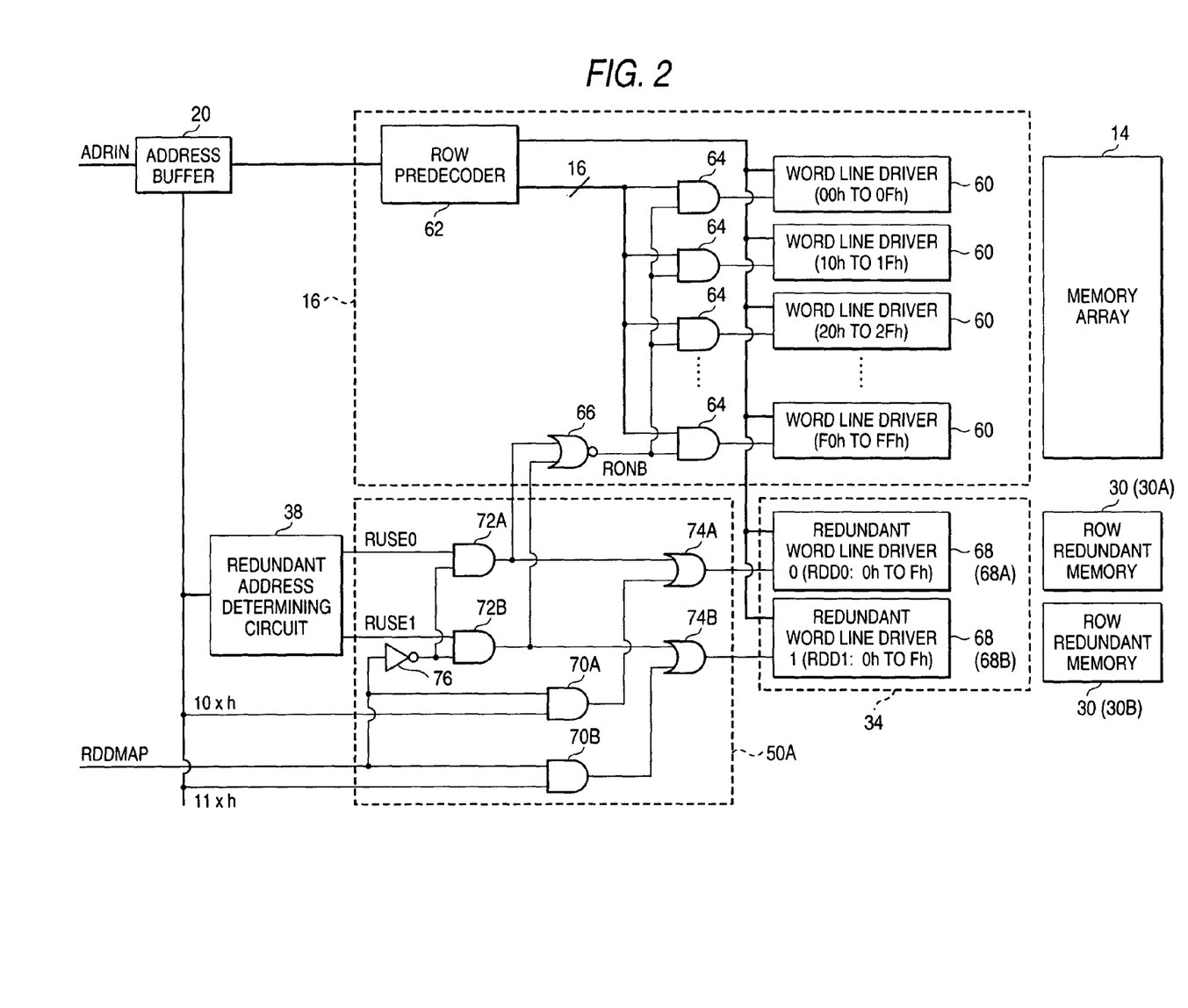
FIG. 2 is a circuit diagram illustrating the detailed configuration of a portion related to row replacement of the semiconductor memory device in the first embodiment.

More specifically, the semiconductor memory device 10 is disposed with two row redundant memories 30 for a single memory cell 12 (see FIG. 2. Hereafter, they are called row redundant memories 30A and 30B when they are distinguished from each other) and one column redundant memory 32. Only one set of the memory cell 12, the row redundant memory 30 and the column redundant memory 32 is shown in FIG. 1. However, a plurality of pairs is actually disposed in the column direction (two pairs in the embodiment), and the word lines 40 are shared among the plurality of the pairs.

Hereafter, when the memory cells 12 in the memory array 14 is distinguished from the memory cells 12 in the row redundant memory 30 and in the column redundant memory 32 for description, the former is referred to as cells 12A and the latter is referred to as redundant cells 12B.

The word lines 40 and the bit lines 42 arranged in the memory array 14 are connected to the row decoder 16 and the column decoder 18, respectively. Each of the word lines 40 arranged in the row redundant memory 30 is connected to the redundant row decoder 34, and each of the bit lines 42 arranged in the column redundant memory 32 is connected to the redundant column decoder 36.

From outside, the address buffer 20 is inputted with an address signal indicating the address of the memory cell 12 to be accessed. It creates a row address signal for specifying the row address and a column address signal for specifying a column address based on the inputted address signal. The address buffer 20 outputs the created row address signal to the row decoder 16 and the redundant row decoder 34, and outputs the column address signal to the column decoder 18 and the redundant column decoder 36. In FIG. 1, connecting wires between the address buffer 20 and the column decoder 18 and between the address buffer 20 and the redundant column decoder 36 are omitted.

The row decoder 16 and the redundant row decoder 34 select the word line 40 corresponding to the row address signal inputted from the address buffer 20, that is, the row of the memory cells 12. The column decoder 18 and the redundant column decoder 36 select the bit line 42 corresponding to the column address signal inputted from the address buffer 20, that is, the column of the memory cells. The corresponding word line 40 and bit line 42 are selected to activate each of the memory cells 12 to be accessible.

The sense amplifier 22 writes information inputted from outside into the activated memory cell 12 through the input/output circuit 24, and amplifies the signal read out of the activated memory cell 12 to output information stored in the memory cell to outside through the input/output circuit 24. Generally, a port for outputting (inputting/outputting) information to outside is disposed in a one-to-one correspondence with the pair of the memory array 14 and the row and column redundant memories 30 and 32. In addition, an information output (input/output) terminal is referred to as DQ terminal. Thus, the correspondences of the separate output terminals DQ0 and DQ1 are shown in FIG. 1.

The address buffer 20 outputs the created row address signals and column address signals to the redundant address determining circuit 38 as well.

The redundant address determining circuit 38 is for replacing a defective cell with the redundant cell 12B in the row redundant memory 30 or in the column redundant memory 32 by the row or column including the defective cell when the cells 12A in the memory array 14 have the defective cell, which corresponds to a redundancy repair control unit of the invention. The redundant address determining circuit 38 analyzes the row address signals and the column address signals inputted from the address buffer 20. It deactivates the row decoder 16A and the column decoder 18B and activates the redundant row decoder 34 or the redundant column decoder 36 when the address of the memory cell 12 (cell 12A) to be an access subject according to the address signal from outside is a redundant replacement subject. It controls the drive of the redundant row decoder 34 or redundant column decoder 36 so as to select the redundant cell replaced from the row redundant memory 30 or the column redundant memory 32.

As shown in FIG. 1, the semiconductor memory device 10 in the embodiment is further provided with a test mode control circuit 50A. In the test mode, the test mode control circuit 50A ignores the operation of the redundant address determining circuit 38, and controls the redundant cells in the row redundant memory 30 and in the column redundant memory 32 to be accessible as if they are the memory cells disposed at the lower or upper address space in the address space of the original device (that is, the cells in the memory array 14), which corresponds to a test mode control unit of the invention.

Next, the test mode control circuit 50A will be described in detail with reference to FIG. 2. In FIG. 2, only the configuration for row replacement is shown, omitting column replacement because it is implemented by the same configuration. Hereafter, only the configuration of row replacement will be described in detail, omitting the description of column replacement.

As shown in FIG. 2, to the test mode control circuit 50A, a signal indicating the test mode is inputted from outside, that is, signal RDDMAP for instructing whether to dispose a redundant cell at an address space upper or lower than the cell, and signals 10xh and 11xh for selecting the row redundant memories 30A and 30B is inputted from the address buffer 20. The signal RDDMAP is high in the test mode, and is low in the other cases. The signals 10xh and 11xh are high when the row addresses are 100h to 10Fh and 110h to 11Fh, and is low in the other cases.

The test mode control circuit 50A has first AND circuits 70A and 70B, second AND circuits 72A and 72B, and OR circuits 74A and 74B in correspondence with each of redundant word line drivers 68A and 68B. In addition, the test mode control circuit 50A also has a NOT circuit 76 for inverting the signal RDDMAP.

The signal RDDMAP inputted from outside is inputted to the first AND circuits 70A and 70B. The first AND circuits 70A and 70B are connected to the address buffer 20. The signal 10xh is inputted to the first AND circuit 70A, and the signal 11xh is inputted to the first AND circuit 70B. The outputs of the first AND circuits 70A and 70B are connected to the OR circuits 74A and 74B, respectively. To the OR circuits 74A and 74B, the AND operation result of the signal RDDMAP and the signal 10xh and the AND operation result of the signal RDDMAP and the signal 11xh are inputted, respectively.

The signal RDDMAP inputted from outside is also inputted to the NOT circuit 76. The output of the NOT circuit 76 is branched and connected to the second AND circuits 72A and 72B, respectively. More specifically, the signal RDDMAP is inverted by the NOT circuit 76, and inputted to the second AND circuits 72A and 72B. The second AND circuits 72A and 72B are also connected to the redundant address determining circuit 38. Signal RUSE0 is inputted to the second AND circuit 72A, and signal RUSE1 is inputted to the second AND circuit 72B.

The outputs of the second AND circuits 72A and 72B are connected to a NOR circuit 66. In the NOR circuit 66, the AND operation results of the inversion signal of the signal RDDMAP and each of the signals RUSE0 and RUSE1 undergo the NOR operation to create signal RONB.

The outputs of the second AND circuits 72A and 72B are also connected to the OR circuits 74A and 74B, respectively. The OR circuit 74A performs the OR operation of the first AND circuit 70A and the second AND circuit 72A. The OR circuit 74B performs the OR operation of the first AND circuit 70B and the second AND circuit 72B, and outputs the signals indicating the OR operation result to the corresponding word line drivers 68A and 68B as the drive signals for driving the drivers.

Next, addressing performed in the semiconductor memory device 10 will be described.

In selecting the redundancy replacement subject when the normal operation and after the redundancy replacement, the signal RDDMAP from outside is low. In this case, the outputs of the first AND circuits 70A and 70B are low, and the signals RUSE0 and RUSE1 from the redundant address determining circuit 38 are outputted to the second AND circuits 72A and 72B as they are, which is the same addressing as before, thus omitting the description.

In the test mode, the signal RDDMAP is high, the signal RDDMAP is inverted by the NOT circuit 76, and the low signal is inputted to the second AND circuits 72A and 72B. Therefore, the output of the redundant address determining circuit 38, that is, the control by the redundant address determining circuit 38 is invalid. Accordingly, even though the redundancy replacement subject is selected, the output signal RONB of the NOR circuit 66 is turned to be high to allow the word line drivers 60 to be activated for selecting the word lines 40 in the memory array 14 (redundancy replacement is not performed).

In this case, not only the signals indicating the address space of the original device (that is, the cells in the memory array 14) but also the signals indicating the address space upper or lower than the address space of the original device are also inputted as the address signals from outside.

When the address signals from outside correspond to the address space of the original device, a row predecoder 62 inputs a signal for selecting the word line driver 60 to the corresponding AND circuit 64 based on the address signals, and the AND circuit 64 activates the corresponding word line driver 60. At the same time, the row predecoder 62 outputs the signals for selecting the word lines, and the activated word line driver 60 selects the separate word lines based on the signals for selecting the word lines.

When the address signal indicating the address upper or lower than the address space of the original device is inputted from outside, the address buffer 20 turns the signal 10xh or the signal 11xh to be high according to the address signal, and the redundant word line driver 68A or 68B is activated. For example, when the address signals indicating the row addresses 100h to 10Fh are inputted, the signal 10xh is turned to be high, and the output of the first AND circuit 70A is turned to be high to activate the redundant word line driver 68A. For instance, when the address signals indicating the row addresses 110h to 11Fh are inputted, the signal 11xh is turned to be high, and the output of the first AND circuit 70B is turned to be high to activate the redundant word line driver 68B.

At the same time, the row predecoder 62 outputs the signal for selecting the word lines, and the activated redundant word line driver 68A or 68B selects the separate word lines based on the signal for selecting the word lines. Accordingly, the row redundant memory 30A and 30B can be allocated to the row addresses 100to 10Fh or 110h to 11Fh upper than the address space of the original device.

The addressing to the row redundant memories 30 has been described above, but the same is done to the column redundant memory 32.

Next, the operation of the semiconductor memory device 10 in the embodiment in the test mode will be described specifically in contrast to the related art.

First, addressing to the row redundant memories 30 will be described with reference to FIGS. 3A, 3B, 4A and 4B. In FIGS. 3A, 3B, 4A and 4B, only a single row redundant memory is depicted for simple description.

Figure 3:
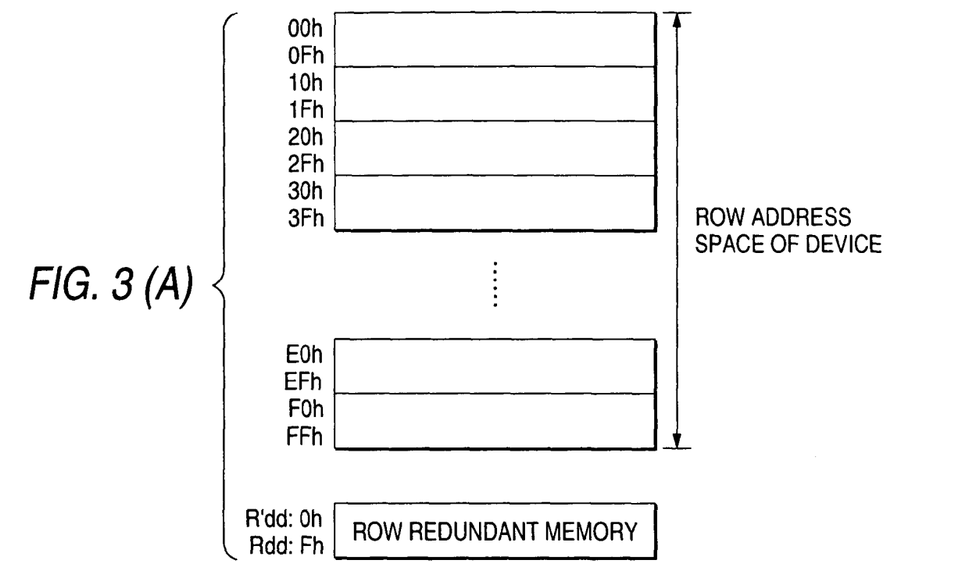
FIGS. 3A and 3B are conceptual diagrams illustrating a row address space when a row redundant memory is not used (3A), and the row address space of the device when the row redundant memory is used (3B) in the traditional the semiconductor memory device.

For example, as shown in FIGS. 3A and 3B, when the row address (the position of the cells in the row direction) space of the device is 00h to FFh (the last digit h indicates a hexadecimal number), access is made to the cells 12A corresponding to the row addresses 00h to FFh as the access space of the memory array 14 in the case where the redundant cells are not used.

Traditionally, the row address space from 00h to FFh of the device undergoes the operation test. Consequently, a defective cell is included in the row addresses 10h to 1Fh in the memory address space, for example, and redundancy replacement is performed. As shown in FIG. 3B, instead of having access to the cells corresponding to the row addresses 10h to 1Fh, control is performed in which one of the two row redundant memories 30 is selected to be accessible and access is made to the redundant cells at the row addresses Rdd: 0h to Fh in the selected row redundant memory 30 for repairing the defective cell. However, at this point in time, it is uncertain whether the redundant cells at Rdd: 0h to Fh in the row redundant memory 30 are normal or not. When the redundant cells at Rdd: 0h to Fh in the row redundant memory 30 include a defective bit, the repair fails.

On the other hand, in the semiconductor memory device 10, the addresses upper or lower than the row address space of the device are assigned to the row redundant memory 30 for the operation test. For example, as shown in FIGS. 4A and 4B, 100h to 10Fh are assigned as the row addresses of the device to the row addresses Rdd: 0h to Fh in one of the row redundant memories 30 (in addition, 110h to 11Fh are assigned as the row addresses of the device to the row addresses Rdd: 0h to Fh in the other row redundant memory 30, but omitted).

Figure 4:
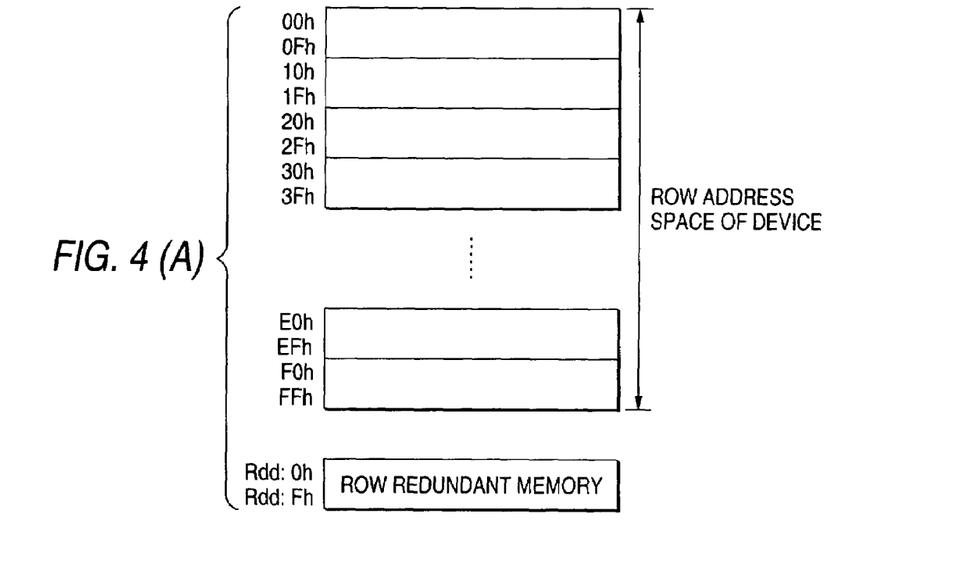
FIGS. 4A and 4B are conceptual diagrams illustrating a row address space when a row redundant memory is not used (4A), and the row address space of the device in the test mode (4B) in the semiconductor memory device in the first embodiment.
Figure 5:
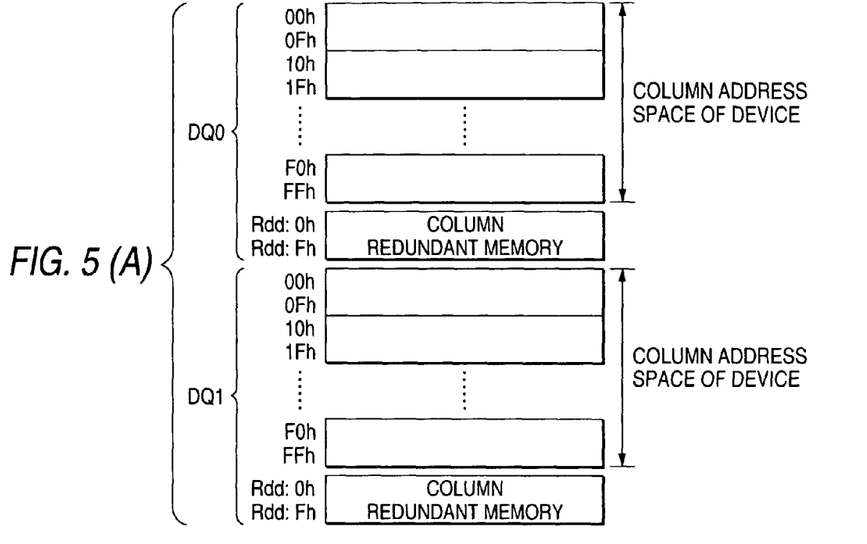
FIGS. 5A and 5b are conceptual diagrams illustrating a column address space when a the column redundant memory is not used (5A), and the column address space of the device when the column redundant memory is used (5B) in the traditional semiconductor memory device.
Figure 6:
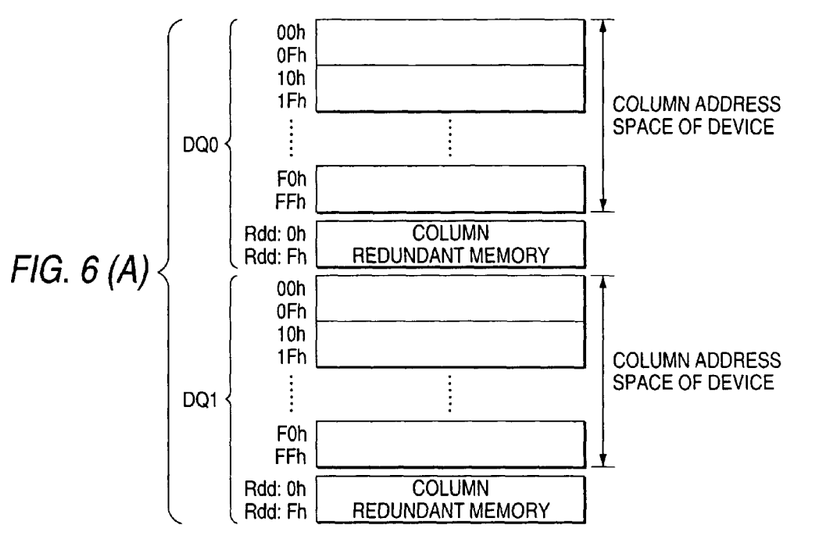
FIGS. 6A and 6B are conceptual diagrams illustrating a column address space when a column redundant memory is not used (6A), and the column address space of the device in the test mode (6B) in the semiconductor memory device in the first embodiment.

Accordingly, the row address space of the device is formed to be the address area from 00h to 10Fh where the addresses assigned to the redundant cells are included in the original address space, and the row redundant memory 30 is accessible, as if the row redundant memory 30 is combined with the memory array 14 in one memory. The memory array 14 and the row redundant memories 30 can undergo the operation test collectively without performing redundancy replacement. Then, when the operation test finds a defective cell in the cell area corresponding to the row address space from 00h to FFh, it is fine to replace the defective cell with a redundant cell in the row redundant memory 30 verified to be a normal memory cell by the operation test.

In addition, the same thing can be said on the column redundant memory 32 as the row redundant memory 30, which will be described with reference to FIGS. 5A, 5B, 6A and 6B. In FIGS. 5A, 5B, 6A and 6B, only a single column redundant memory 32 is shown for simple description.

More specifically, as shown in FIG. 5A, when the column address space of the device is 0h to FFh, for example, and the redundant cells are not used, access is made to the cells corresponding to the column addresses 0h to FFh as the access space in the memory array.

Traditionally, the column address space from 00h to FFh of the device undergoes the operation test. Consequently, a defective cell is included in the column addresses 10h to 1Fh in the memory space, for example, and redundancy replacement is conducted. Then, as shown in FIG. 5B, instead of having access to the cells corresponding to the column addresses 10h to 1Fh, control is done in which one of the two column redundant memories 32 is selected to be accessible and access is made to the redundant cells at the column addresses Rdd: 0h to Fh in the selected column redundant memory 32 for repairing the defective cell. However, at this point in time, it is uncertain whether the redundant cells at Rdd: 0h to Fh in the column redundant memory 32 having undergone redundancy replacement are normal or not. When the redundant cells at Rdd: 0h to Fh in the column redundant memory 32 have a defective bit, the repair fails.

On the other hand, in the semiconductor memory device 10, the addresses upper or lower than the row address space of the device are assigned to the column redundant memory 32 for the operation test. For example, as shown in FIGS. 6A and 6B, to the column addresses Rdd: 0h to Fh in one of the column redundant memories 32, 100h to 10Fh are assigned as the column addresses of the device (in addition, to the column addresses Rdd: 0h to Fh in the other column redundant memory 32, 110h to 11Fh are assigned as the column addresses of the device, but omitted).

Accordingly, the column address space of the device is formed to be the address area from 00h to 10Fh where the addresses assigned to the redundant cells are included in the original address space, and the column redundant memory 32 is accessible, as if the column redundant memory 32 is combined with the memory array 14 in one memory. The memory array 14 and the column redundant memory 32 can undergo the operation test collectively without conducting redundancy replacement. Then, when the operation test finds a defective cell in the cell area corresponding to 00h to FFh in the column address space, it is fine to replace the defective cell with a redundant cell in the column redundant memory 32 verified to be a normal memory cell by the operation test.

FIGS. 5A to 6B are the example where two memory arrays 14 are mounted in the semiconductor memory device and they correspond to the output terminals DQ0 and DQ1, respectively.

In this manner, in the first embodiment, the row redundant memories 30 and the column redundant memories 32 are accessible without conducting the redundancy replacement process, and they can be tested whether each of the redundant cells in the redundant memories is normal or not before redundancy replacement. Accordingly, when the cells have a defective cell to require replacement with a redundant cell, the redundant cell not to be a defective cell is selected for allowing row replacement or column replacement even though the defective cell is included in the redundant memory. The repair is not failed, and yields can be improved. The cells and the redundant cells can be verified at one time, a retest after redundancy replacement can be simplified, and the total time to require the test can be shortened.

Figure 7:
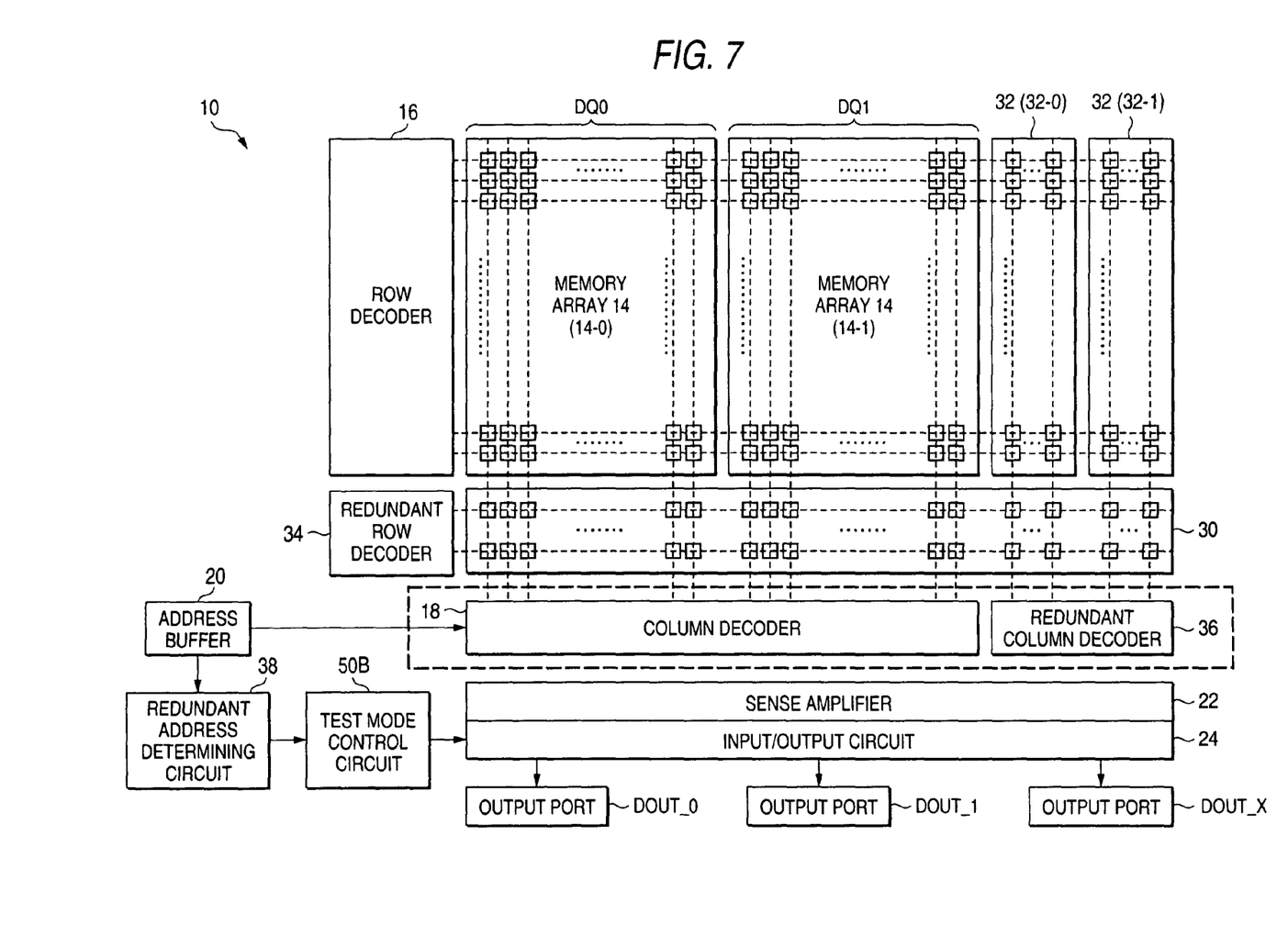
FIG. 7 is a block diagram illustrating the schematic configuration of a semiconductor memory device in a second embodiment.

Next, as a second embodiment of the invention, the case will be described in which the semiconductor memory device with the redundancy repair function is configured to share redundant memories by a plurality of memory arrays. FIG. 7 depicts the circuit configuration of a semiconductor memory device 10 in the second embodiment of the invention. In FIG. 7, the same members as those in FIG. 1 are designated the same numbers. Moreover in FIG. 7, connecting wires between the address buffer 20 and the row decoder 16 and between the address buffer 20 and the redundant row decoder 34 are omitted.

As shown in FIG. 7, the semiconductor memory device 10 in the second embodiment is disposed with two memory arrays 14 (designated 14_0 and 14_1 when they are distinguished from each other) and two column redundant memories 32 (designated 32_0 and 32_1 when they are distinguished from each other), which is configured to share the two column redundant memories 32 by the two memory arrays 14. Each of the memory arrays 14 has 256 lines of bit lines, and the column addresses are 00h to FFh. Each of the column redundant memories 32 has 16 lines of bit lines, that is, each of them is configured of 16 columns of memory cells.

Hereafter, on the components for each of the memory arrays 14, those corresponding to the memory array 14A have '_0' at the last of the numerals and signs, and those corresponding to the memory array 14B have '_1' when the corresponding memory arrays 14 are distinguished for description, as similar to FIG. 2. Also on the components for the column redundant memories 32, those corresponding to the column redundant memory 32A have '_0' at the last of the numerals and signs, and those corresponding to the column redundant memory 32B have '_1' when the corresponding column redundant memories 32 are distinguished for description.

The semiconductor memory device 10 has two output ports (input/output ports are acceptable) DOUT_0 and DOUT_1 in total as first ports of the invention, one port for each memory array 14. Information stored in the memory cells 12 in each of the memory arrays 14 is outputted to outside through the corresponding output ports DOUT_0 and DOUT_1.

The semiconductor memory device 10 in the embodiment further has a second output port DOUT_X as a second port of the invention other than the output ports DOUT_0 and DOUT_1, and a test mode control circuit 50B.

The test mode control circuit 50B ignores the operation of a redundant address determining circuit 38 in the test mode. It uses the second output port DOUT_X as the lower or upper port of the output ports DOUT_0 and DOUT_1. It controls the redundant cells in the column redundant memory 32_0 and the column redundant memory 32_1 to be accessible as if to be the memory cells disposed to the second output port DOUT_X. It corresponds to a test mode control unit of the invention.

Figure 8:
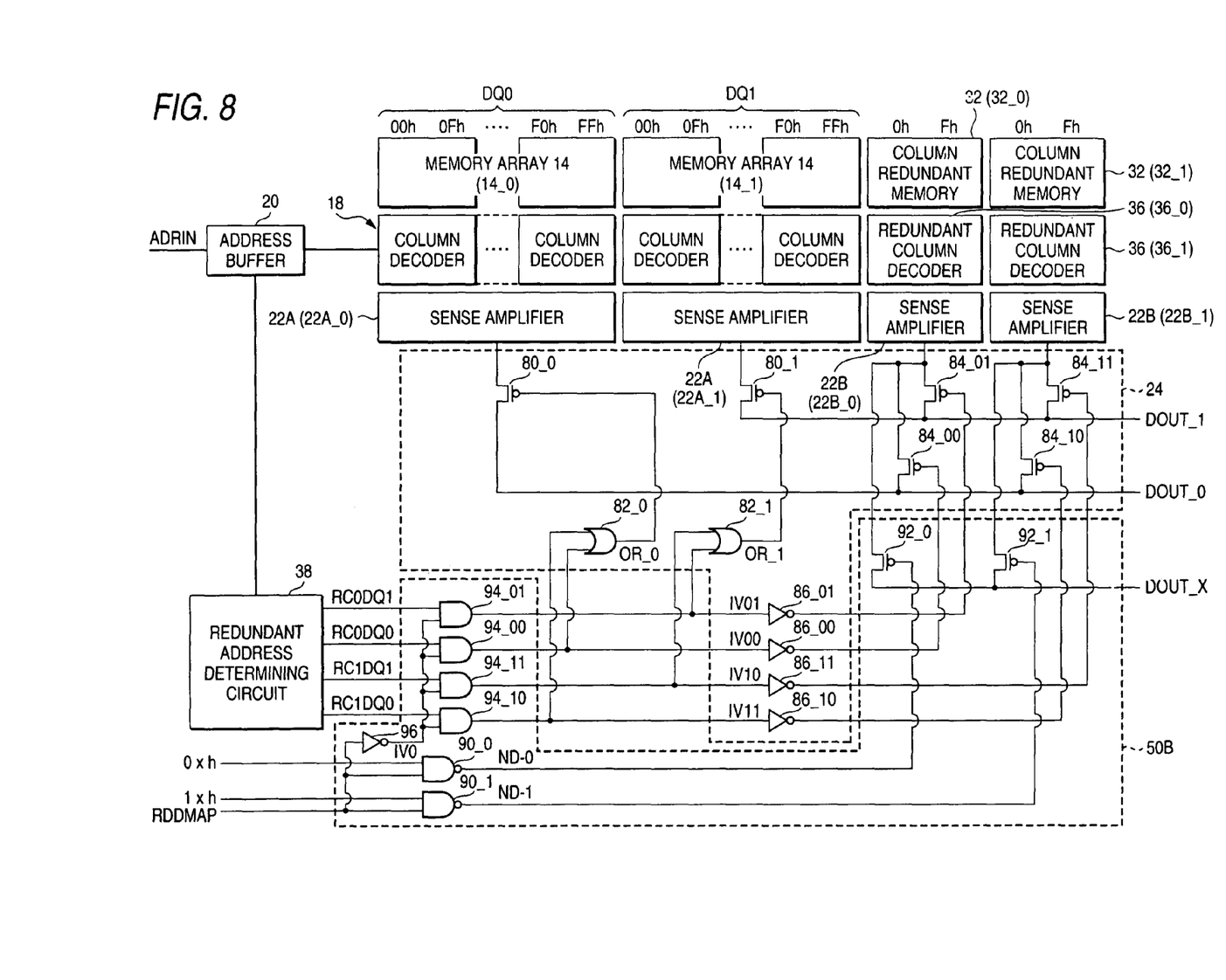
FIG. 8 is a circuit diagram illustrating the detailed configuration related to column replacement of the semiconductor memory device in the second embodiment.

Next, the test mode control circuit 50B will be described in detail with reference to FIG. 8. In FIG. 8, only the configuration for column replacement is shown, omitting row replacement, because it is fine to apply the configuration described in the first embodiment. Hereafter, only column replacement will be described in detail. In FIG. 8, the same members as those in FIG. 2 are designated the same numbers, thus omitting the detailed description below.

As shown in FIG. 8, to the test mode control circuit SOB, a signal indicating the test mode is inputted from outside, that is, signal RDDMAP for instructing whether to have access to the column redundant memories 32 as memories disposed to the upper or lower output port DOUT_X of the original output ports DOUT_0 and DOUT_1 of the device, and signals 0xh and 1xh for selecting the column redundant memories 32_0 and 32_1, respectively, are inputted. In addition, the signal RDDMAP is high in the test mode, and is low in the other cases. The signals 0xh and 1xh are high when access is made to the column redundant memories 32_0 and 32_1 as memories disposed to the output port DOUT_X, and they are low in the other cases.

The test mode control circuit 50B has NAND circuits 90_0 and 90_1 and third switching gates 92_0 and 92_1, in correspondence with each of the column redundant memories 32_0 and 32_1. Furthermore, the test mode control circuit 50B has AND circuits 94_00, 94_01, 94_10 and 94_11 in correspondence with output signals RC0DQ0, RC0DQ1, RC1DQ0 and RC1DQ1 of the redundant address determining circuit 38. Moreover, the test mode control circuit SOB further has a NOT circuit 96 for inverting the signal RDDMAP.

The signal RDDMAP inputted from outside is inputted to the NAND circuits 90_0 and 90_1. To the NAND circuits 90_0 and 90_1, the signals 0xh and 1xh inputted from outside are also inputted. The outputs of the NAND circuits 90_0 and 90_1 are connected to the switching gates 92_0 and 92_1, respectively. The NAND circuits 90_0 and 90_1 create signal ND_0 for indicating the NAND operation result of the signal RDDMAP and the signal 0xh and signal ND_1 for indicating the NAND operation result of the signal RDDMAP and the signal 1xh, and they feed the signals to the switching gates 92_0 and 92_1 as the switching signals.

The third switching gates 92_0 and 92_1 are for turning on/off the connection between the second output port DOUT_X and sense amplifiers 22B_0 and 22B_1 disposed in correspondence with the column redundant memories 32_0 and 32_1. It turns on the connection when the switching signal is low, whereas it turns off the connection when the signal is high.

The signal RDDMAP inputted from outside is also inputted to the NOT circuit 96. The output of the NOT circuit 96 is branched and connected to the AND circuits 94_00, 94_01, 94_10 and 94_11. More specifically, the signal RDDMAP is inverted by the NOT circuit 96 and inputted to the AND circuits 94_00, 94_01, 94_10 and 94_11. The AND circuits 94_00, 94_01, 94_10 and 94_11 are also connected to the redundant address determining circuit 38. To the AND circuits 94_00, 94_01, 94_10 and 94_11, the corresponding output signals RC0DQ0, RC0DQ1, RC1DQ0 and RC1DQ1 of the redundant address determining circuit 38 are inputted.

Among the AND circuits 94, the outputs of the AND circuits 94_00 and 94_10 are connected to an OR circuit 82_0, and the outputs of the AND circuits 94_01 and 94_11 are connected to an OR circuit 82_1. More specifically, to the OR circuit 82_1, the signals indicating the AND operation results of the inversion signal of the signal RDDMAP and the signals RC0DQ0 and RC1DQ0. In the OR circuit 82_0, these input signals undergo the OR operation to create the signal OR0. To the OR circuit 82_1, the AND operation results of the inversion signal of the signal RDDMAP and the signals RC0DQ1 and RC1DQ1 are inputted. In the OR circuit 82_1, these input signals undergo the OR operation to create the signal OR1.

The outputs of the AND circuits 94_00, 94_01, 94_10 and 94_11 are also connected to the NOT circuits 86_00, 86_01, 86_10 and 86_11. To switching gate circuits 84_00, 84_01, 84_10 and 84_11, the output signals of the corresponding AND circuits 94_00, 94_01, 94_10 and 94_11 are inverted and fed as the switching signals.

Next, addressing performed in the semiconductor memory device 10 will be described.

In selecting the redundancy replacement subject when the normal operation and after redundancy replacement, the signals RDDMAP, 0xh and 1xh from outside are all low. In this case, the signals ND0 and ND1 are turned to be high, and the third switching gates 92_0 and 92_1 are in the off-state. To the AND circuits 94_00, 94_01, 94_10 and 94_11, the signal RDDMAP is inverted by the NOT circuit 96 and the high signal is inputted. They output the output signals RC0DQ0, RC0DQ1, RC1DQ0 and RC1DQ1 sent from the redundant address determining circuit 38 as they are, which is the same addressing as before, thus omitting the description.

In the test mode, the signal RDDMAP is turned to be high, and the signal RDDMAP is inverted by the NOT circuit 96 to input the low signal to the AND circuits 94_00, 94_01, 94_10 and 94_11. Therefore, the output of the redundant address determining circuit 38, that is, the control of the redundant address determining circuit 38 is invalid. Accordingly, even though the redundancy replacement subject is selected, the control of the redundant address determining circuit 38 is cancelled. The output signals of the AND circuits 94_00, 94_01, 94_10 and 94_11 are turned to be low, and the output signals OR0 and OR1 of the OR circuit 82_0 and 82_1 are still low. Therefore, switching gates 80_0 and 80_1 remain in the on-state. The output signals of the AND circuits 94_00, 94_01, 94_10 and 94_11 are inverted and the high switching signals are fed to the switching gates 84_00, 84_01, 84_10 and 84_11 to be in the off-state.

Accordingly, the output port DOUT_0 is accessible to the memory array 14_0, and the output port DOUT_1 is accessible to the memory array 14_1.

In the test mode, any one of the signals 0xh and 1xh is turned to be high in accordance with the column redundant memories 32_0 and 32_1 to be the test subject. Thus, the output of any one of the NAND circuits 90_0 and 90_1 is turned to be low. For example, when the column redundant memory 32_0 is tested, the signal 0xh is turned to be high. Consequently, the output of the NAND circuit 90_0 is turned to be low, and the third switching gate 92_0 is in the on-state. For instance, when the column redundant memory 32_1 is tested, the signal 1xh is turned to be high. Consequently, the output of the NAND circuit 90_1 is turned to be low, and the third switching gate 92_1 is in the on-state. Accordingly, in the test mode, the second output port DOUT_X is accessible to the column redundant memory 32_0 or 32_1.

In this condition, when the address signals are inputted from outside, the separate column decoders 18 and redundant column decoders 36 select the bit lines corresponding to the address signals indicating the column addresses from the address buffer 20. Then, information in the memory cells 12 corresponding to the address signals is read out of the memory arrays 14_0 and 14_1, and it is amplified by the sense amplifier 22A_0 and 22A_1 to be outputted to outside from the output ports DOUT_0 and DOUT_1. When the address signals indicating the column addresses 0h to Fh are inputted, information in the memory cells 12 (redundant cells) corresponding to the addresses is also read out of the column redundant memory 32_0 or 32_1 at the same time. It is amplified by the redundant sense amplifier 22B_0 or 22B_1 to be outputted to outside from the second output port DOUT_X. Accordingly, the column redundant memories 32_0 and 32_1 are assigned to the second output port DOUT_X different from the output ports DOUT_0 and DOUT_1 of the original device, and access can be made to the column redundant memories 32_0 and 32_1 as memories disposed to the second output port DOUT_X upper or lower than the output ports DOUT_0 and DOUT_1.

Next, the operation of the semiconductor memory device 10 in the embodiment in the test mode will be described specifically with reference to FIGS. 9A, 9B, 10A and 10B in contrast to the related art. In FIGS. 9A, 9B, 10A and 10B, only a single column redundant memory 32 is shown for simple description.

Figure 9:
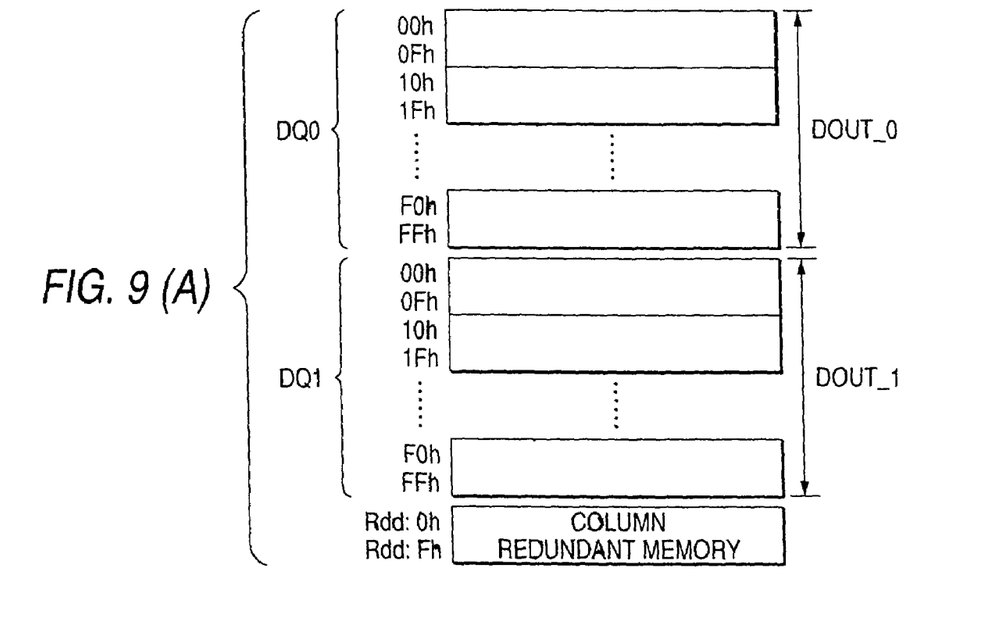
FIGS. 9A and 9B are conceptual diagrams illustrating the correspondence of memory cells to output ports when column redundant memories are not used (9A), and the correspondence of the memory cells to the output ports when the column redundant memories are used (9B) in the traditional the semiconductor memory device.

For example, as shown in FIG. 9A, when the column address (the position indicating the cells in the column direction) space of the device is 00h to FFh, the output ports DOUT_0 and DOUT_1 have access to the cells corresponding to the column addresses 00h to FFh in the memory arrays 14_0 and 14_1, in the case where the redundant cells are not used.

Traditionally, in the operation test, the column address space from 00h to FFh in the memory arrays 14_0 and 14_1 undergoes the operation test. Consequently, a defective cell is included in the column addresses 10h to 1Fh in the memory space of the memory array 14_1, for example, and redundancy replacement is conducted. As shown in FIG. 9B, instead of having access to the cells corresponding to the column addresses 10h to 1Fh in the memory array 14_1, control is done in which one of the two column redundant memories 32 is selected to be accessible and access is made to the redundant cells at the row addresses Rdd: 0h to Fh in the selected row redundant memory 30 for repairing the defective cell. However, at this point in time, it is uncertain whether all the replaced redundant cells at Rdd: 0h to Fh in the row redundant memory 30 are normal or not. When the redundant cells at Rdd: 0h to Fh in the row redundant memory 30 have a defective bit, the repair fails.

Figure 10:
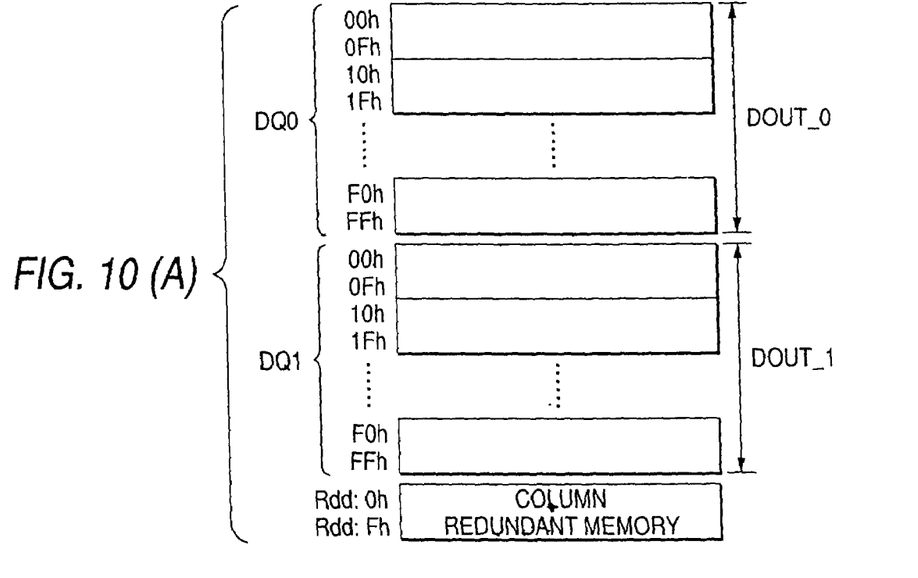
FIGS. 10A and 10B conceptual diagrams illustrating the correspondence of memory cells to output ports when column redundant memories are not used (10A), and the correspondence of the memory cells to the output ports in the test mode (10B) in the semiconductor memory device in the second embodiment.

On the other hand, in the semiconductor memory device 10, the second output port DOUT_X different from the output ports DOUT_0 and DOUT_1 of the original device is assigned to the column redundant memories 32. The column redundant memories 32_0 and 32_1 are handled as memories disposed to the second output port DOUT_X upper or lower than the output ports DOUT_0 and DOUT_1 for the operation test.

Accordingly, the second output port DOUT_X has access to the column redundant memories 32 (any one of 32_0 and 32_1) during the output ports DOUT_0 and DOUT_1 having access to the memory cells in the memory arrays 14_0 and 14_1. Consequently, the memory arrays 14 and the column redundant memories 32 undergo the operation test collectively without conducting redundancy replacement. When the operation test finds a defective cell in the cell area corresponding to the column address space from 00h to FFh in the memory array 14, it is fine to replace the defective cell with a redundant cell in the column redundant memory 32 verified to be a normal memory cell by the operation test.

In this manner, in the second embodiment, the column redundant memories 32 are accessible without conducting the redundancy replacement process, and the column redundant memories can be tested before redundancy replacement. Accordingly, when the cells have a defective cell to require replacement with a redundant cell, a redundant cell not to be a defective cell is selected for column replacement even though the column redundant memories have a defective cell. The repair is not failed, and yields can be improved. The redundant cells and the cells can be verified at one time, a retest after redundancy replacement can be simplified, and the total time to require the test can be shortened.

As described above, the invention has the excellent advantages to improve yields and to shorten the test time for redundancy repair.

The present invention may include a method of testing a semiconductor memory. For example, the present invention can be applied to a method for testing a semiconductor memory device having a plurality of memory cells, each of them assigned a unique address beforehand, redundant cells equivalent to the memory cells, the redundant cells being replaceable with the memory cells, and a redundancy repair function mode for replacing a predetermined memory cell with the redundant cell. The method comprises assigning an address to the redundant cell, the address neighboring an address space defined by the unique addresses of the plurality of the memory cells; allowing the memory cells and the redundant cells to be accessible in an address area where the address of the redundant cell is included in the address space of the plurality of the memory cells; and testing the plurality of the memory cells and the redundant cells.

Further, the present invention may includes a method for testing a semiconductor memory device comprising, providing a first port for having access to the plurality of the memory cells and a second port for having access to the redundant cells beforehand; setting the first port to be accessible to the memory cells and the redundant cells in a redundancy repair function mode; and setting the first port to be accessible to the memory cells and the second port to be accessible to the redundant cells to test the plurality of the memory cells and the redundant cells in a test mode.

What is claimed is:

1. A semiconductor memory device comprising:
    a plurality of memory cells, each of which is assigned a unique address to be accessed by a corresponding address;
    a plurality of redundant cells being replaceable with the memory cells;
    a redundancy repair control circuit replacing a plurality of predetermined memory cells among the memory cells with the redundant cells; and
    a test mode control circuit invalidating an operation of the redundancy repair control circuit and assigning an additional unique address to the redundant cells so that all of the memory cells and the redundant cells are accessible during a test mode.

2. A semiconductor memory device according to claim 1, wherein the test mode control circuit disabling an output of the redundancy repair control circuit.

3. A semiconductor memory device according to claim 1, further comprising a sense amplifier and an input/output circuit.

4. A semiconductor memory device according to claim 1, further comprising a row decoder and a redundant row decoder.

5. A semiconductor memory device according to claim 1, wherein the test mode control circuit includes a plurality of gate circuits.

6. A semiconductor memory device comprising:
    a memory cell array including a plurality of memory rows assigned addresses designated from 1 to n including non-redundant addresses and redundant addresses, wherein n is a natural number, and a plurality of redundant memory rows;
    a row decoder accessing the memory rows in response to the non-redundant addresses;
    a redundant row decoder accessing the redundant memory rows in response to the redundant addresses;
    a redundant address determining circuit coupled to the redundant row decoder for determining the redundant addresses among the addresses; and
    a test mode control circuit invalidating an operation of the redundant address determining circuit and assigning an additional address assigned n+1 to m to the redundant rows so that all of the memory rows and the redundant rows are accessible during a test mode, wherein m is a natural number greater than n.

7. A semiconductor memory device according to claim 6, wherein the test mode control circuit disabling an output of the redundant address determining circuit.

8. A semiconductor memory device according to claim 6, further comprising a sense amplifier and an input/output circuit.

9. A semiconductor memory device according to claim 6, wherein the test mode control circuit includes a plurality of gate circuits.

10. A semiconductor memory device according to claim 6, further comprising an additional memory cell array including a plurality of memory rows, wherein the redundant memory rows are used for the memory cell array and the additional memory cell array.

11. A semiconductor memory device according to claim 6, further comprising an address buffer.

12. A semiconductor memory device comprising:
    a memory cell array including a plurality of memory rows assigned addresses designated from 1 to n, the addresses including non-redundant addresses and redundant addresses, wherein n is a natural number;
    a plurality of redundant memory rows;
    a row decoder coupled to the memory cell array for accessing the memory rows in response to the non-redundant addresses;
    a redundant address determining circuit determining the redundant addresses among the addresses;
    a redundant row decoder coupled to the redundant memory rows and the redundant address determining circuit for accessing the redundant memory rows in response to the redundant addresses; and
    a test mode control circuit invalidating the redundant address determining circuit and assigning an additional address assigned n+1 to m to the redundant rows so that all of the memory rows and the redundant memory rows are accessible during a test mode, wherein m is a natural number greater than n.

13. A semiconductor memory device according to claim 12, wherein the test mode control circuit disabling an output of the redundant address determining circuit.

14. A semiconductor memory device according to claim 12, further comprising a sense amplifier and an input/output circuit.

15. A semiconductor memory device according to claim 12, wherein the test mode control circuit includes a plurality of gate circuits.

16. A semiconductor memory device according to claim 12, further comprising an additional memory cell array including a plurality of memory rows, wherein the redundant memory rows are used for the memory cell array and the additional memory cell array.

17. A semiconductor memory device according to claim 12, further comprising an address buffer.

* * * * *